(12) United States Patent
Lee et al.

(10) Patent No.: US 11,388,826 B2
(45) Date of Patent: Jul. 12, 2022

(54) SURFACE MODIFICATIONS FOR ENHANCED ADHESION BETWEEN COMPONENTS

(71) Applicant: Apple Inc., Cupertino, CA (US)

(72) Inventors: Simon S. Lee, San Jose, CA (US); Lauren M. Farrell, Cupertino, CA (US); Raisul Haque, San Jose, CA (US)

(73) Assignee: Apple Inc., Cupertino, CA (US)

( * ) Notice: Subject to any disclaimer, the term of this patent is extended or adjusted under 35 U.S.C. 154(b) by 106 days.

(21) Appl. No.: 17/033,419

(22) Filed: Sep. 25, 2020

(65) Prior Publication Data
US 2022/0104368 A1    Mar. 31, 2022

(51) Int. Cl.
H05K 7/02     (2006.01)
H05K 7/04     (2006.01)
H05K 5/02     (2006.01)
H05K 5/00     (2006.01)

(52) U.S. Cl.
CPC ......... *H05K 5/0217* (2013.01); *H05K 5/0017* (2013.01)

(58) Field of Classification Search
CPC combination set(s) only.
See application file for complete search history.

(56) References Cited

U.S. PATENT DOCUMENTS

| | | | |
|---|---|---|---|
| 4,411,943 A * | 10/1983 | Akao | B32B 27/06 428/161 |
| 5,868,887 A | 2/1999 | Sylvester et al. | |
| 7,625,625 B2 | 12/2009 | Rios et al. | |
| 8,243,444 B2 * | 8/2012 | Kawada | G06F 1/1656 361/679.59 |
| 10,563,683 B2 * | 2/2020 | Lebovitz | F16B 11/006 |
| 2005/0073506 A1 | 4/2005 | Durso | |

(Continued)

OTHER PUBLICATIONS

Jeevi et al., "Review on adhesive joints and their application in hybrid composite structures", Journal of Adhesion Science and Technology, vol. 33, Issue 14, https://www.tandfonline.com/doi/full/10.1080/01694243.2018.1543528, retrieved Sep. 7, 2020, 40 pages.

(Continued)

*Primary Examiner* — Hung S. Bui
(74) *Attorney, Agent, or Firm* — Dickinson Wright RLLP

(57) ABSTRACT

An electronic device is disclosed. The electronic device may include a display or desktop computing device with a display. The electronic device may be part of a system that includes a stand designed to support the electronic device, and further allow the electronic device to rotate to different positions. In order to control the relative rotational movement of the electronic device, a friction member is secured with the electronic device by an adhesive. The rotation, however, exerts shear forces on the friction member and the adhesive. In order to prevent delamination of the friction member from the housing due to the shear forces, the housing is modified to include protruding elements that penetrate, or extend into, the adhesive. The protruding elements can mechanically interlock with the adhesive to offset the shear forces, and also created additional surface with which the adhesive can bond.

20 Claims, 15 Drawing Sheets

(56) References Cited

U.S. PATENT DOCUMENTS

2012/0252543 A1* 10/2012 Cho ................... F16M 13/022
                                                         455/575.8
2015/0223328 A1   8/2015 Endoh et al.
2018/0122201 A1*  5/2018 Chiang ................ H04M 1/02

OTHER PUBLICATIONS

Bisgani et al., "Experimental investigation of reinforced bonded joints for composite laminates", NIH.gov, https://www.ncbi.nlm.nih.gov/pmc/articles/PMC5836537/, retrieved Sep. 7, 2020, 28 pages.

* cited by examiner

SURFACE MODIFICATIONS FOR ENHANCED ADHESION BETWEEN COMPONENTS

FIELD

The following description relates to surface modifications that receives an adhesive. In particular, the following description relates to enhancements of a substrate surface that increases the bond/adhesion strength between an adhesive and the substrate, thus improving retention of a structure adhered to the substrate by the adhesive. The substrate surface may include modifications, such as a barbed surface or otherwise textured surface, that increases the surface energy of the substrate, thereby increasing the bond between the adhesive and the substrate. The techniques described herein improve the bond between two parts, particularly when the parts are made dissimilar materials.

BACKGROUND

Adhesives can be used to secure together two parts. Ideally, the parts provide sufficient surface energy such that the adhesive is well-bonded to each part. However, the material makeup of some parts may not provide sufficient surface energy, particularly when one of the parts is exposed to a shear force. As a result, the shear force, applied repeatedly over time, overcomes bond between the adhesive and the (relatively low) surface energy part, and the two parts become disassembled.

SUMMARY

In one aspect, an electronic device is described. The electronic device may include a display. The electronic device may further include a housing coupled with the display. The housing may include a back wall formed from a first type material, such as a metal (including aluminum, as a non-limiting example). The housing may further include protruding elements extending from the back wall. The electronic device may further include an adhesive layer disposed on the back wall. The protruding elements may extend into the adhesive layer. The electronic device may further include a friction member formed from a second type material different than the first type material. For example, the friction member may include a polymer (e.g., rubber) or some other non-metal. The friction member can be secured with the back wall by the adhesive layer.

In another aspect, an electronic device is described. The electronic device may include a display. The electronic device may further include a housing coupled with the display. The housing may include sidewalls. The housing may further include a back wall that combines with the sidewalls to define an internal volume. The back wall may include a first surface and a second surface opposite the first surface. The housing may further include protruding elements disposed on the back wall. The protruding elements may extend from the first surface. The electronic device may further include an adhesive layer disposed on the first surface. The adhesive layer may cover the protruding elements. The electronic device may further include a magnet disposed in the internal volume and secured with the second surface. The magnet may be configured to magnetically couple with a magnet of a stand. The electronic device may further include a friction member secured with the back wall by the adhesive layer. The friction member may be configured to engage at least one of the magnet or the stand.

In another aspect, an electronic device is described. The electronic device may include a display. The electronic device may further include a housing coupled with the display. The housing may include a back wall. The housing may further include a first protruding element extending from the back wall. The first protruding element may include a first tip oriented in a first direction. The housing may further include a second protruding element extending from the back wall and adjacent to the first protruding element. The second protruding element may include a second tip oriented in a second direction opposite the first direction. The electronic device may further include an adhesive layer disposed on the back wall, wherein the first protruding element and the second protruding element extend into the adhesive layer. The electronic device may further include a plate secured with the back wall by the adhesive layer. The electronic device may further include a friction member secured with the plate.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
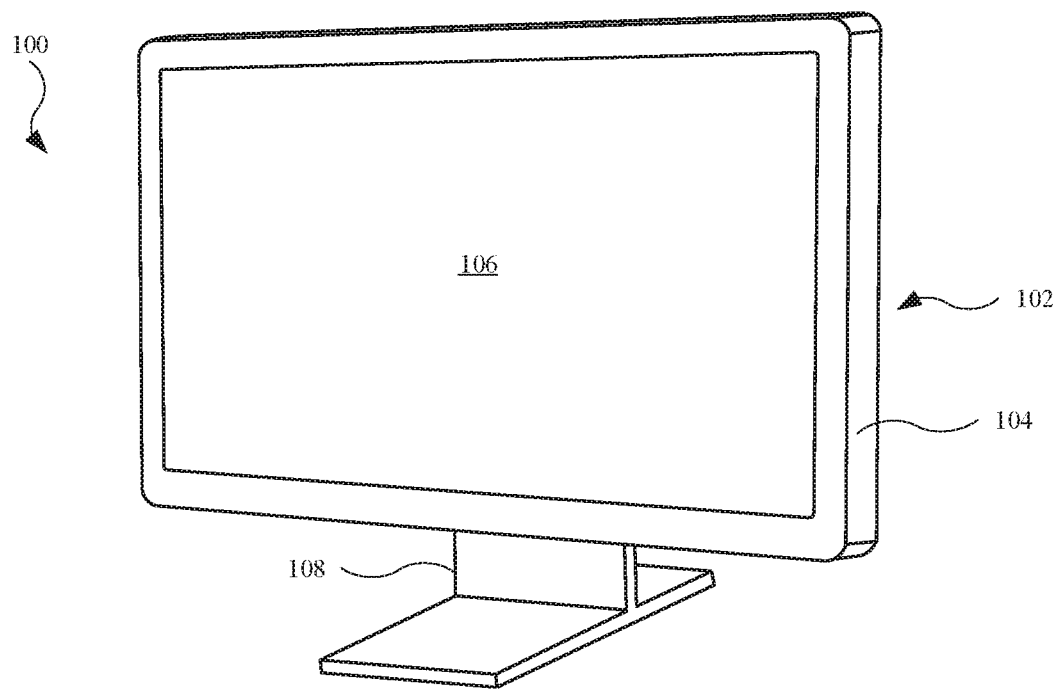
FIG. 1 illustrates a front isometric view of an embodiment of an electronic device.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to enhancements to an electronic device to improve the retention of a structure with a housing of the electronic device. The structure may include a friction member, or friction pad, bonded to the housing by an adhesive. The housing can be modified to include a textured surface, or barbed surface, defined by several protruding elements that increase the surface energy of the housing and provide additional surface area with which the adhesive can bond. In this regard, the adhesive can bond and mechanically interlock with the protruding elements, in addition to bonding with the flat surrounding surface of the housing. In some instances, the protruding elements (defining features that extend from the housing) are oriented, or pointed, in different directions, and as a result, provide additional support to the adhesive by countering forces exerted on the friction member in different directions.

The electronic device and the stand are formed from one type of material (e.g., metal(s)), and the friction member may include a different type of material, such as a polymer material (e.g., rubber). In this regard, the friction member may provide a generally scratch-resistant buffer between the electronic device and the stand. Additionally, the friction member allows the electronic device to rotate on a stand (e.g., to a "portrait" or "landscape" orientation). When the display is orientated according to the user's desired orientation, the friction member provides sufficient frictional engagement with the stand such that the display remains in the desired orientation and will not rotate until the user applies a rotational force to the electronic device. In this regard, the friction member may be in constant contact with the stand, thus controlling the rotation of the electronic device while remaining frictionally engaged with the stand.

While the friction member provides multiple benefits, externally applied forces (e.g., shear forces or torsional forces) exerted on the friction member during rotation of the electronic device may cause the friction member to fall off over time. Also, when the electronic device is pulled apart from the stand, the friction member (having been engaged with the stand) may be at least partially adhered to the stand, creating yet another force acting to remove the friction member from the electronic device. Also, metals generally provides sufficient surface energy for adhesive bonding, non-metals may not. For instance, the polymer material that forms the friction member may include a relative low surface energy. However, the protruding elements can overcome the low surface energy of the friction member. As a result, the manufacturer is generally free to select from several different materials for the electronic device housing and/or the friction member. In to further improve the bonding, in some exemplary embodiments, the friction member is over molded to a sheet metal layer, and the sheet metal layer (having higher surface energy than that of the friction member) is bonded to the adhesive.

These and other embodiments are discussed below with reference to FIGS. 1-22. However, those skilled in the art will readily appreciate that the detailed description given herein with respect to these Figures is for explanatory purposes only and should not be construed as limiting.

FIG. 1 illustrates a front isometric view of an embodiment of an electronic device 100. In some embodiments, electronic device 100 includes a desktop computing device. In the embodiment shown in FIG. 1, electronic device 100 includes a standalone display designed to communicate with an external electronic device (not shown), such as a desktop computing device or laptop computing device, as non-limiting examples.

Electronic device 100 may include a housing 102, or enclosure. Housing 102 may include several sidewalls (such as a sidewall 104, representative of additional sidewalls) and a back wall (not shown in FIG. 1). The back wall and sidewalls combine to define an internal volume, or space, that holds components, such as processing circuitry (e.g., central processing unit, graphics processing unit, integrated circuits), memory circuits, fans, audio speakers, microphones, cameras, batteries, and flexible circuitry to electrically couple together the components. Housing 102 may include a metal, such as aluminum or aluminum alloy, as non-limiting examples.

Electronic device 100 may further include a display 106. Display 106 may include a liquid crystal display or a light-emitting diode display, as non-limiting examples. Display 106 is designed to provide visual information in the form of textual information, still images, and/or motion (video) images. In order to support electronic device 100, a stand 108 can couple with housing 102. Stand 108 is designed to support electronic device 100 in different orientations. This will be shown and described below.

Figure 2:
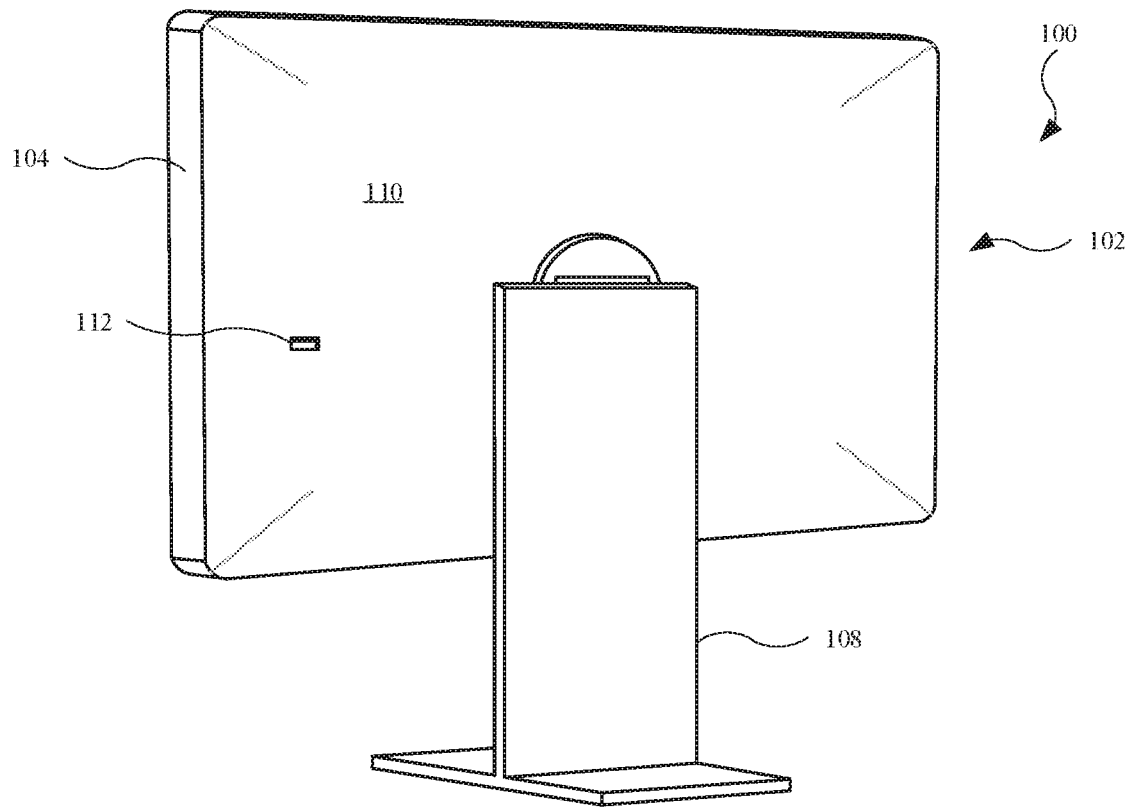
FIG. 2 illustrates a rear isometric view of the electronic device shown in FIG. 1, showing additional features of the electronic device.

FIG. 2 illustrates a rear isometric view of electronic device 100 shown in FIG. 1, showing additional features of electronic device 100. As shown, housing 102 includes a back wall 110 that is designed to connect to stand 108. Back wall 110 and sidewall 104 (as well as other sidewalls) may be integrally formed from a monolithic material. Electronic device 100 includes a port 112 aligned with an opening of back wall 110. Port 112 (representative of additional ports) is designed to electrically couple electronic device 100 with an external electronic device. Port 112 may be designed in accordance with an industry standard, such as Universal Serial Bus ("USB"), including USB-C, as non-limiting examples.

Figure 3:
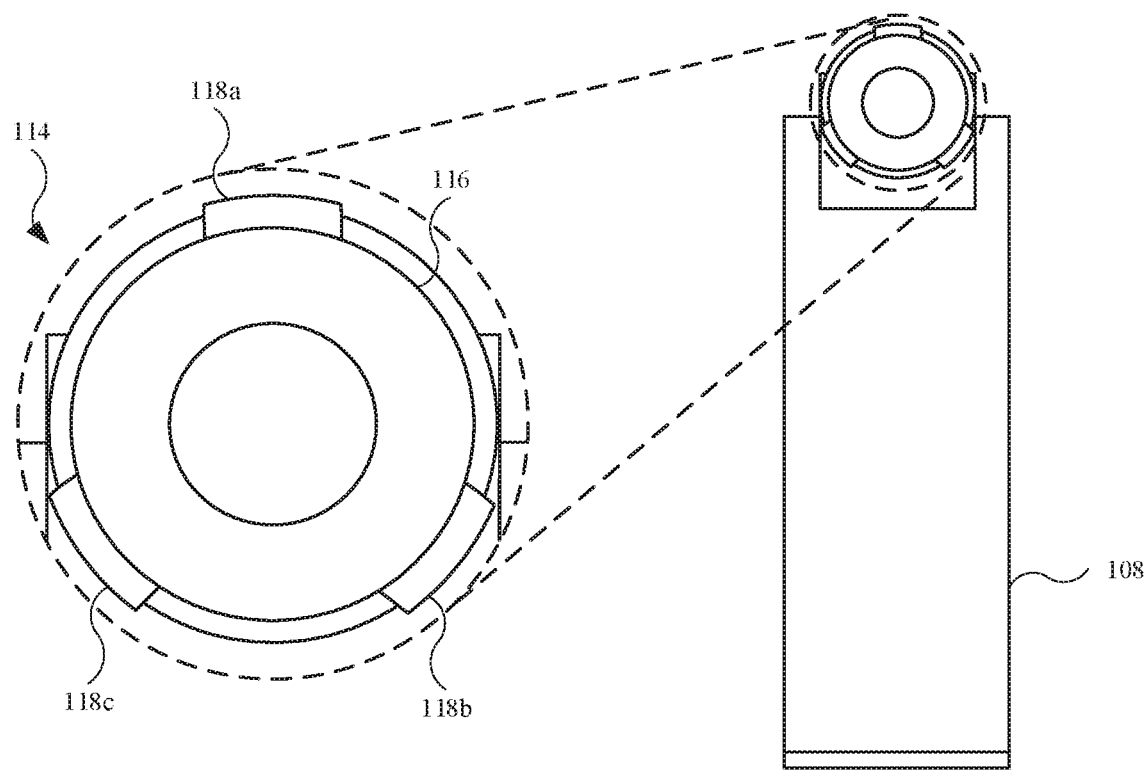
FIG. 3 illustrates a plan view of the stand.

FIG. 3 illustrates a plan view of stand 108. As shown in the enlarged view, stand 108 includes a connection module 114 designed to couple with back wall 110 of electronic device 100 (shown in FIG. 2). Connection module 114 may include a magnet 116 designed to magnetically couple with a magnet of electronic device 100. Magnet 116 may be an exposed magnet, or alternative, magnet 116 may be covered by a structure (e.g., plate) of connection module 114. Connection module 114 may further include a latch mechanism 118a, a latch mechanism 118b, and a latch mechanism 118c. Each of latch mechanisms 118a, 118b, and 118c are designed to mechanically couple with electronic device 100. In this regard, stand 108 can be attached to, and removed from, electronic device 100.

Figure 4:
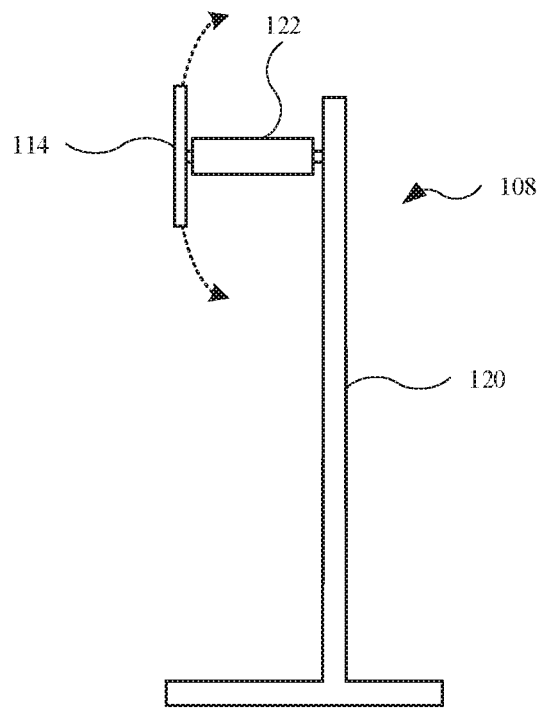
FIG. 4 illustrates a side view of the stand shown in FIG. 3, showing an exemplary movement of the stand.

FIG. 4 illustrates a side view of stand 108 shown in FIG. 3, showing an exemplary movement of stand 108. As shown, stand 108 includes a column 120 that is coupled with connection module 114 by a pivot mechanism 122. Pivot mechanism 122 allows connection module 114 to move in directions defined by the arrows. Accordingly, when electronic device 100 (shown in FIG. 1) is connected to stand 108 by connection module 114, electronic device 100 is capable of moving in the directions defined by the arrows.

Figure 5:
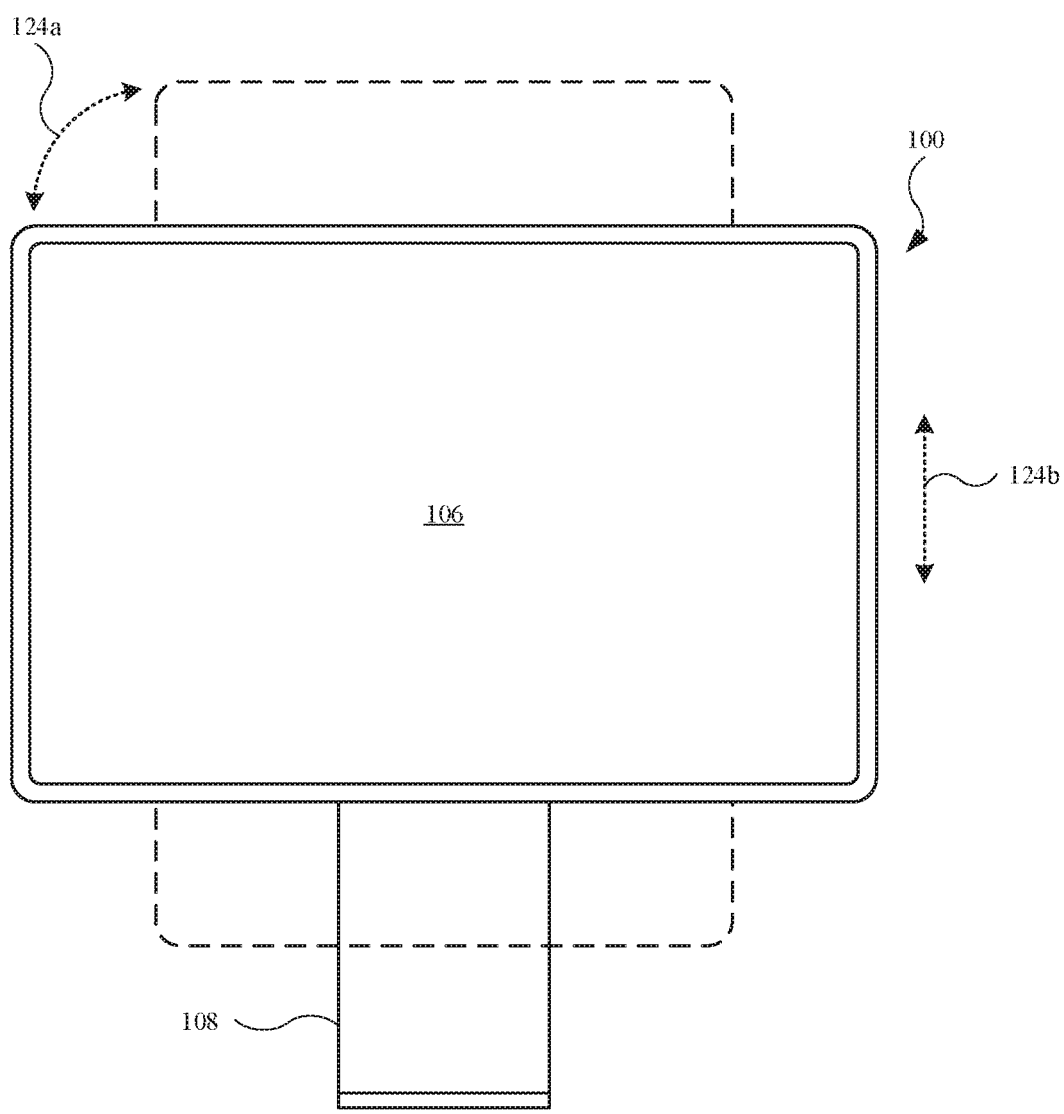
FIG. 5 illustrates a plan view of the electronic device connected to the stand, showing exemplary movement of the electronic device using the stand.

Stand 108 can promote additional movement for electronic device 100. For example, FIG. 5 illustrates a plan view of electronic device 100 connected to stand 108, showing exemplary movement of electronic device 100 using stand 108. As shown, stand 108 allows electronic device 100 to rotate clockwise and counter-clockwise as indicated by an arrow 124a (representing two different directions), and vertically (e.g., up and down) as indicated by an arrow 124b (representing two different directions). Accordingly, electronic device 100, and in particular display 106, can be oriented in several different ways.

Figure 6:
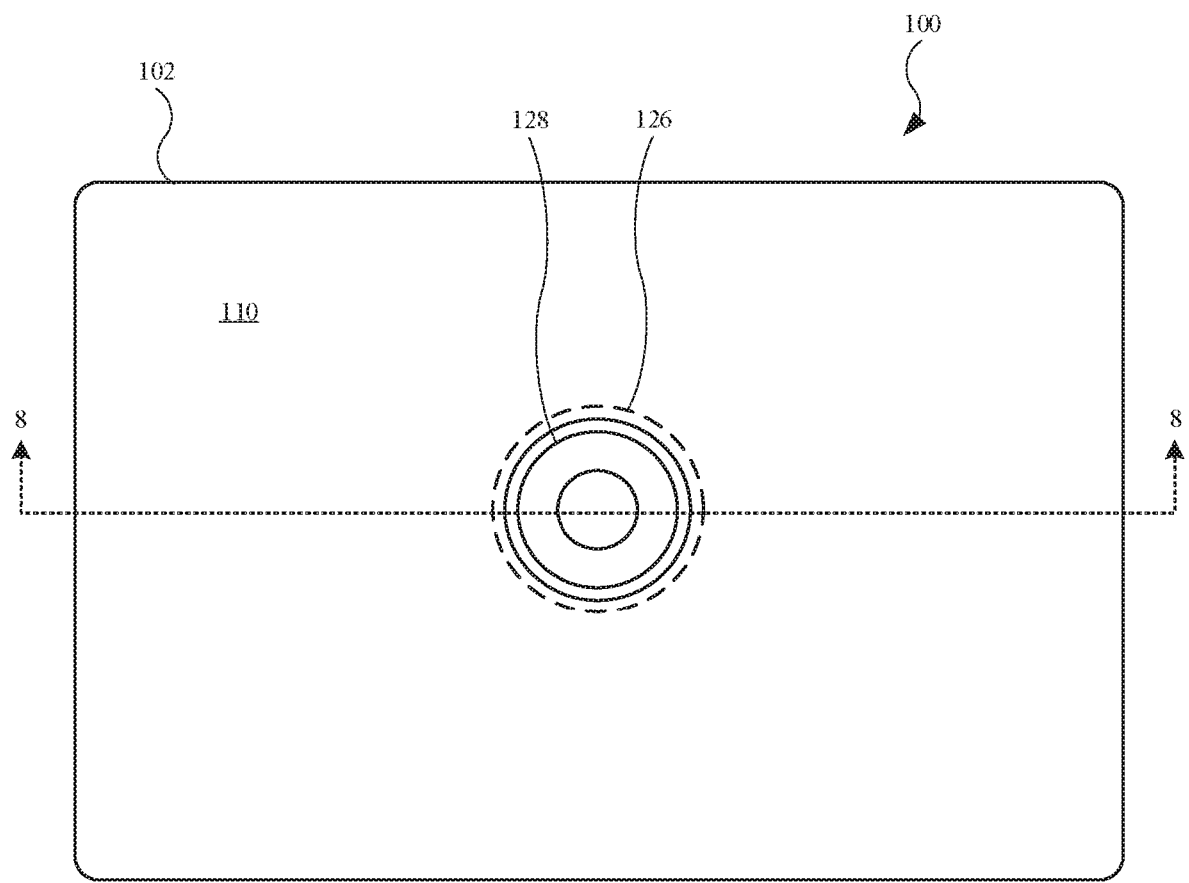
FIG. 6 illustrates a plan view of the electronic device, showing additional features of the electronic device.

FIG. 6 illustrates a plan view of electronic device 100, showing additional features of electronic device 100. In order to mechanically couple with latch mechanism 118a, 118b, and 118c of connection module 114 (shown in FIG. 3), electronic device 100 may include an undercut region 126. Also, electronic device 100 includes a friction member 128, or friction pad, secured with back wall 110 of housing 102. Friction member 128 may include a polymer, such as rubber, or some other non-metal material(s) with a relatively high coefficient of friction. Accordingly, housing 102 may include a first type material (e.g., aluminum) and friction member 128 may include a second type material. While electronic device 100 can rotate relative to stand 108, friction member 128 provides frictional engagement with connection module 114 such that electronic device 100 remains in a desired position/orientation when a rotational force is no longer applied. Additionally, friction member 128 provides some control of the rotational movement of electronic device 100, as friction member 128 may be in constant contact (and thus frictional engagement) with stand 108.

Figure 7:
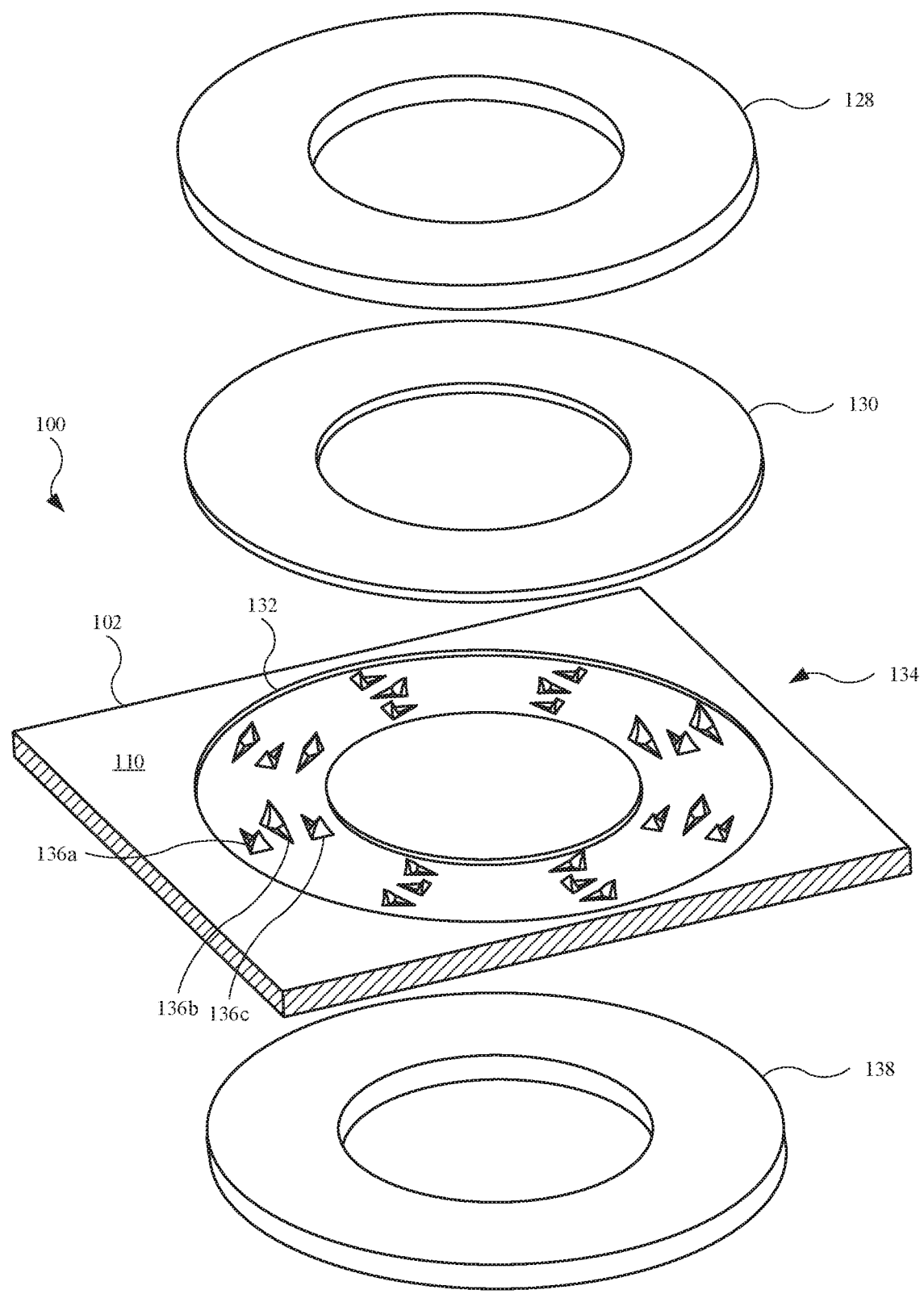
FIG. 7 illustrates an exploded view of the electronic device, showing the features used to secure the friction member with the housing.

FIG. 7 illustrates an exploded view of electronic device 100, showing the features used to secure friction member 128 with housing 102. In order to secure friction member 128 with housing 102, an adhesive layer 130 can bond with friction member 128 and housing 102. Friction member 128 may be disposed on a metal layer (shown later), or plate, with greater surface energy than that of friction member 128, thus improving the retention force of friction member 128 with housing 102 by using a surface of the metal layer as an adhesive bonding surface with adhesive layer 130.

Additionally, back wall 110 includes a recess 132 that provides a sub-flush surface for friction member 128 and adhesive layer 130. As shown, recess 132 includes a circular recess that generally matches the size and shape as that of friction member 128. In this regard, the design (e.g., size and shape) of recess 132 can change to match that of friction member 128.

While adhesive layer 130 provides bonding strength to hold friction member 128, housing 102 can be modified to increase the retention of friction member 128. For example, housing 102 may include several protruding elements 134 extending from back wall 110 of housing 102. As shown, protruding elements 134 include a protruding element 136a, a protruding element 136b, and a protruding element 136c (representative of additional protruding elements). Protruding elements 136a, 136b, and 136c may be referred to as a first protruding element, a second protruding element, and a third protruding element, respectively. Collectively, protruding elements 134 may define a textured surface or a barbed surface. In this regard, protruding elements 134 define a surface texture that is rougher than the remaining surface texture of back wall 110. For example, back wall 110 may primarily include a surface texture defined by an anodized aluminum surface, as a non-limiting example. However, protruding elements 134 are generally raised/elevated surface features as compared to the remaining surface features of back wall 110. Accordingly, the surface texture defined by protruding elements 134 is substantially different than the remaining surface texture of back wall 110.

Based on their location, protruding elements 134 are covered by adhesive layer 130 when friction member 128 is assembled with back wall 110 by adhesive layer 130. When assembled, protruding elements 134 extend into adhesive layer 130. In this regard, protruding elements 134 provide mechanical features that assist adhesive layer 130 in countering or offsetting forces exerted on friction member 128. For example, shear forces exerted on friction member 128 during rotation of electronic device 100 (exemplified in FIG. 5) in the direction of arrow 124a. Additionally, protruding elements 134 may provide additional surface area with which adhesive layer 130 bonds.

Protruding elements 134 may be formed in several ways. For example, a tool (not shown) with several pins can engage back wall 110, and when the tool is twisted, the pins can dig into back wall 110 can extract material from back wall 110 (without fully penetrating through back wall 110) to form protruding elements 134. Alternatively, protruding elements 134 can be formed during the cutting operation for housing 102. As another example, protruding elements 134 may be formed as part of a modified mold cavity and mold core used to create housing 102. These methods should be construed as exemplary and not limiting. Also, it should be noted that based on the formation of protruding element 134, protruding elements 134 may be integrally formed with (e.g., from the same substrate as) housing 102, and in particular, back wall 110.

Also, in order to further couple housing 102 with stand 108 (shown in FIG. 2), electronic device 100 includes a magnet 138. Magnet 138 is located internally within housing 102, and can magnetically couple with magnet 116 (shown in FIG. 3) of stand 108. Magnet 138 can couple internally within housing 102 (i.e., back wall 110) by adhesives, fasteners, soldering, or welding, as non-limiting examples. Also, based on their relative positions, friction member 128 and adhesive layer 130 may be disposed on one (outer) surface of back wall 110 of housing 102, while magnet 138 may be disposed on another (inner) surface of back wall 110 of housing 102.

Figure 8:
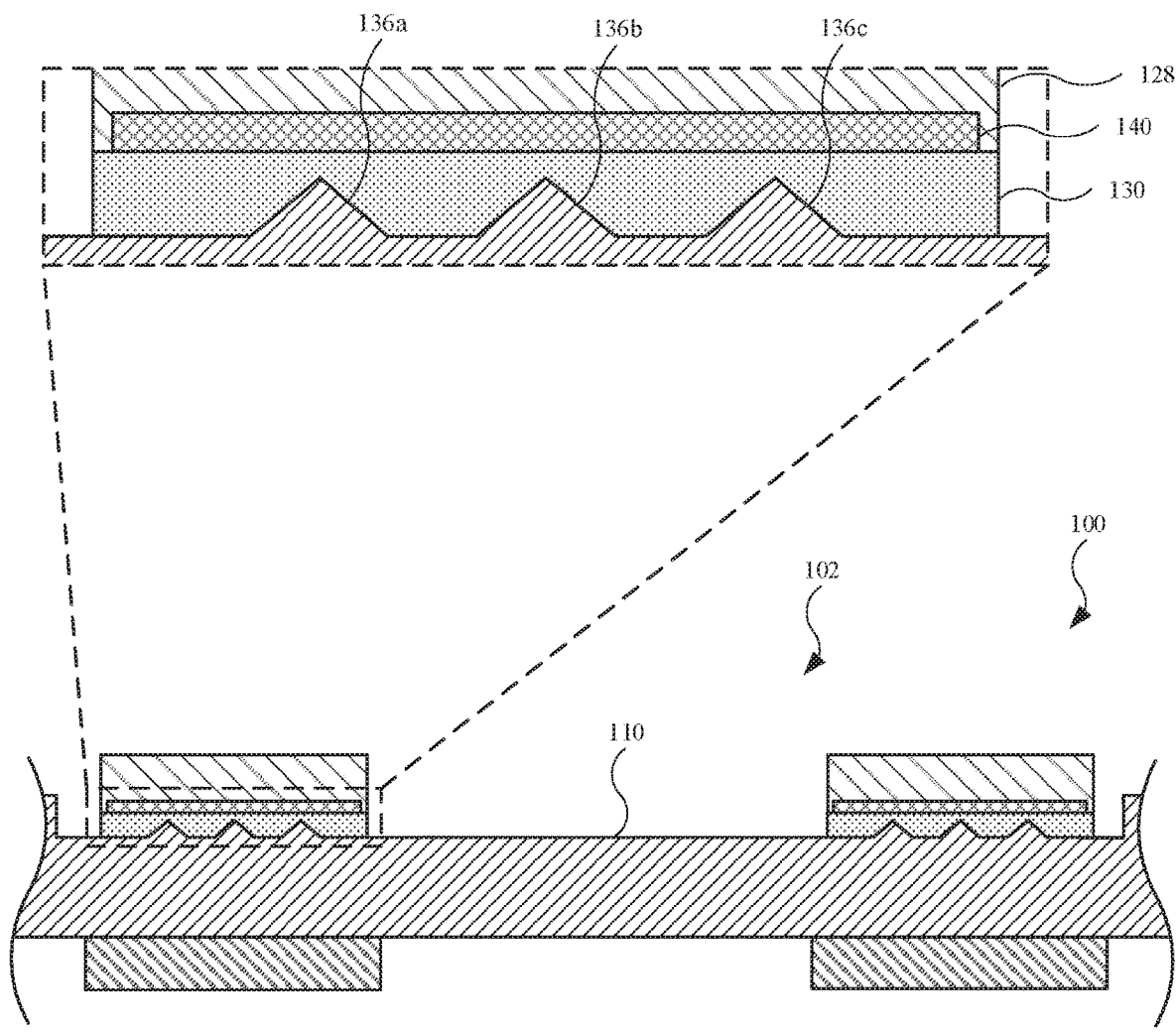
FIG. 8 illustrates a cross sectional view of the electronic device shown in FIG. 6, taken along line 8-8, showing the friction member secured with the housing.

FIG. 8 illustrates a cross sectional view of electronic device 100 shown in FIG. 6, taken along line 8-8, showing friction member 128 secured with housing 102. As shown in the enlarged view, friction member 128 is secured with back wall 110 of housing 102 by adhesive layer 130. Also, a plate 140 is with friction member 128. Plate 140 may include a metal layer/substrate, including a sheet metal layer. Friction member 128 can bond with plate 140 by, for example, over molding friction member 128 to plate 140. Plate 140 can provide an increased surface area, relative to friction member 128. As a result, plate 140, when bonded with adhesive layer 130 (as shown), provides an increased retention force for friction member 128, as opposed to bonding friction member 128 directly to adhesive layer 130.

Also, adhesive layer 130 is bonded to protruding elements 136a, 136b, and 136c, as well as the protruding elements 134 (shown in FIG. 7). As shown, protruding elements 136a, 136b, and 136c extend into adhesive layer 130, thus providing additional surface area for bonding. Additionally, protruding elements 136a, 136b, and 136c each defines a body that can assist in countering shear forces exerted on friction member 128 during rotational movement of electronic device 100. As a result, protruding elements 136a, 136b, and 136c increase the likelihood of friction member 128 remaining secured with back wall 110 despite external forces exerted on friction member 128.

Figure 9:
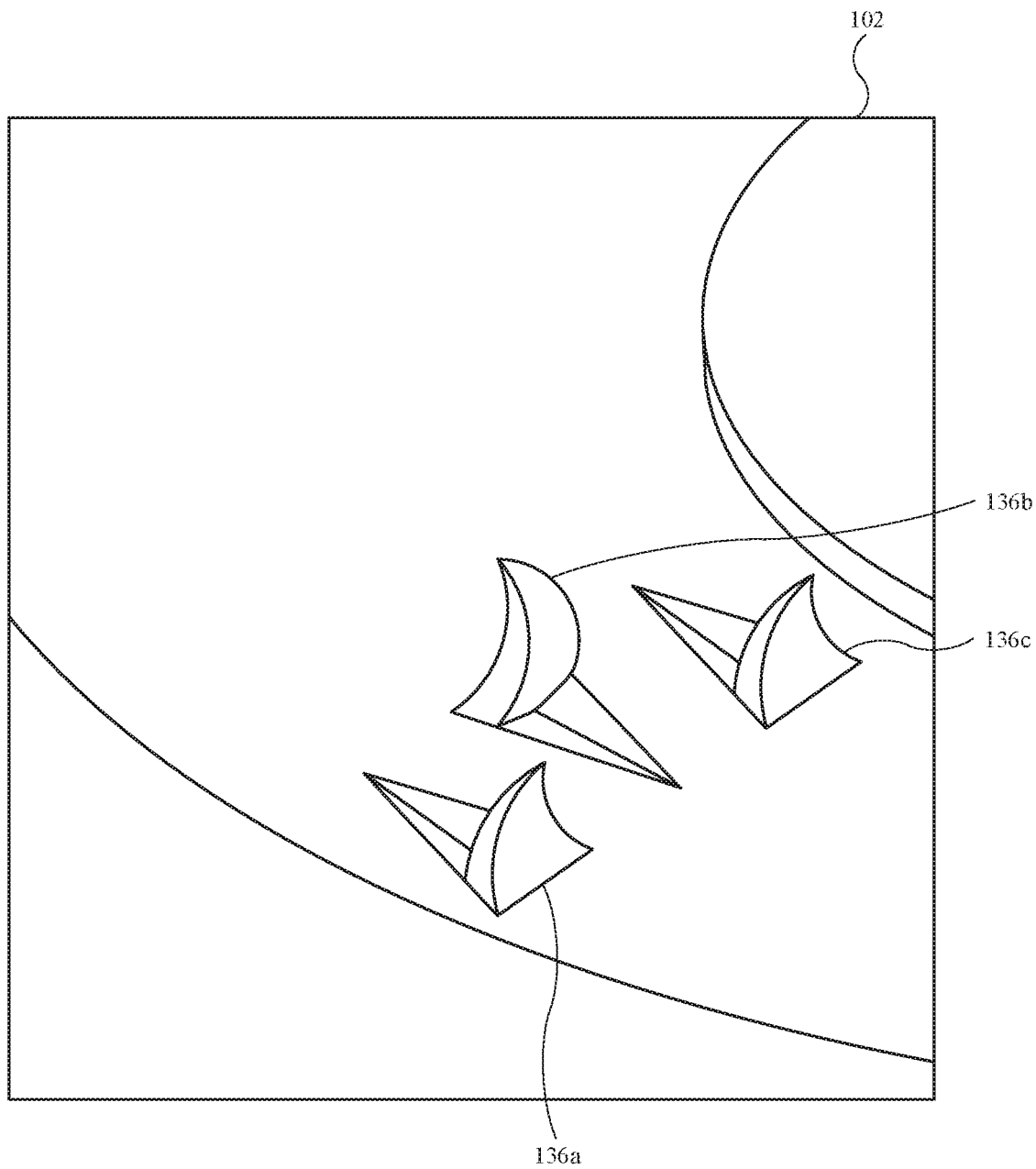
FIG. 9 illustrates an enlarged isometric view of the housing, showing several protruding elements and their associated orientations.

FIG. 9 illustrates an enlarged isometric view of housing 102, showing several protruding elements and their associated orientations. As shown, protruding elements 136a and 136c are formed in a manner such that their respective tips, or end regions, are oriented in one direction, while protruding element 136b is formed in a manner such that its tip, or end region, is oriented in another direction. In some embodiments, protruding elements 136a and 136c are oriented in a direction that is opposite the direction of protruding element 136b. In this regard, protruding elements 136a, 136b, and 136c are oriented to assist adhesive layer 130 (shown in FIG. 8) in withstanding forces in different directions, such as the aforementioned shear forces provided during rotational movement in directions represented by arrow 124a (shown in FIG. 5). For instance, protruding elements 136a and 136c can be oriented to counter shear forces in a counter-clockwise direction, while protruding element 136b can be oriented to counter shear forces in a clockwise direction. Referring again to FIG. 7, it should be noted that protruding elements 134 (representing all protruding elements of located on housing 102) can be oriented in one of the directions represented by protruding element 136a or protruding element 136b.

Figure 10:
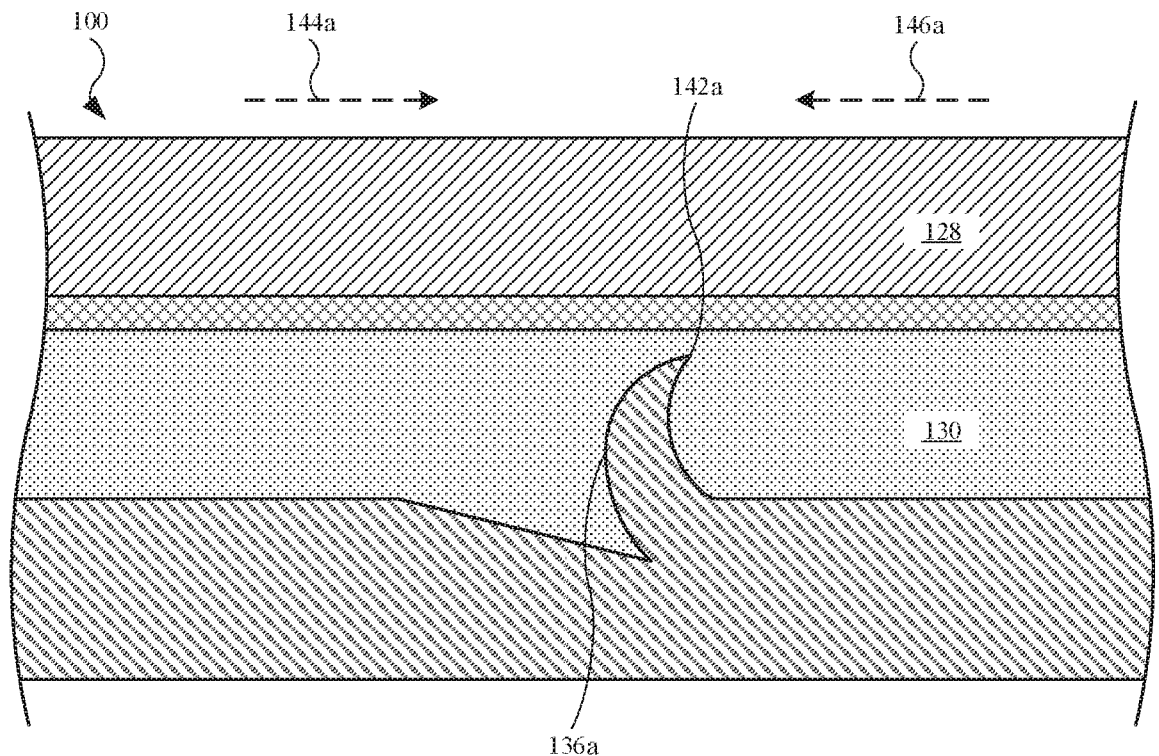
FIGS. 10 and 11 illustrate cross sectional views of the electronic device, showing the orientation of the protruding elements and the associated benefits.
Figure 11:
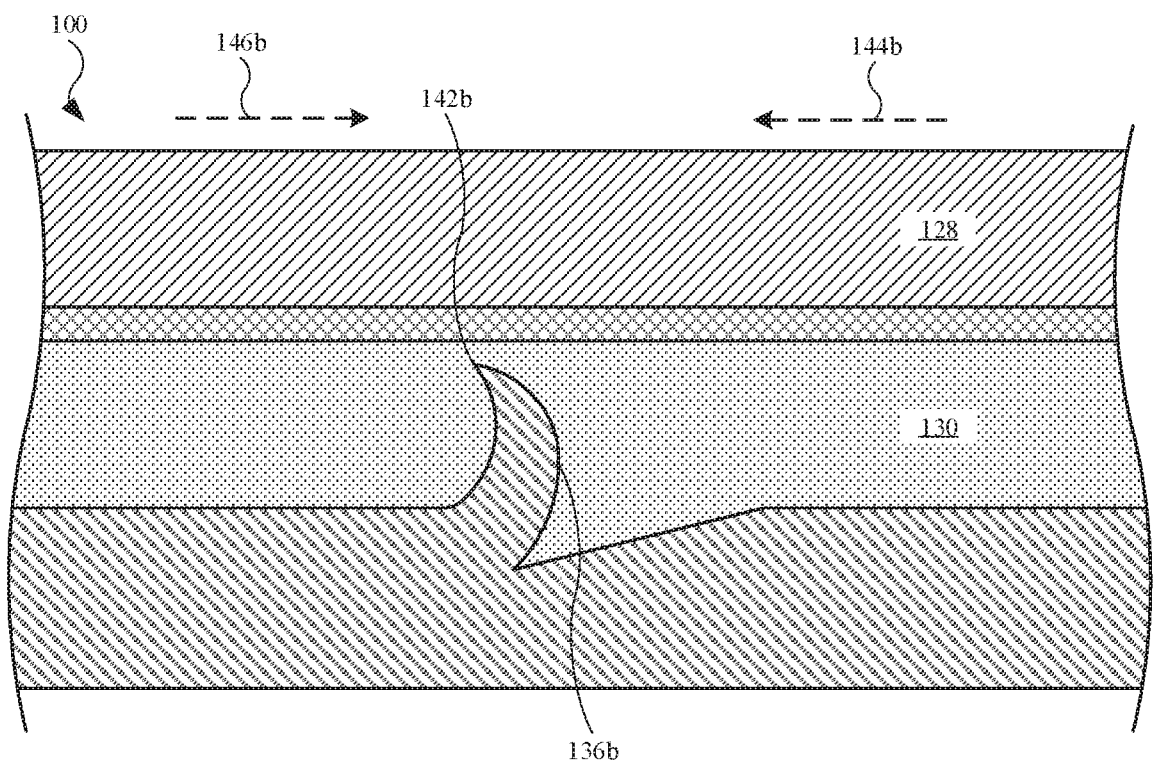

FIGS. 10 and 11 illustrate cross sectional views of electronic device 100, showing the orientation of the protruding elements and the associated benefits. FIG. 10 shows protruding element 136a with a tip 142a, or end region, oriented in a direction denoted by an arrow 144a. Based on the orientation of tip 142a, protruding element 136a can counter a shear force in a direction denoted by an arrow 146a. As shown, arrows 144a and 146a are in opposing directions. Conversely, FIG. 11 shows protruding element 136b with a tip 142b, or end region, oriented in a direction denoted by an arrow 144b. Based on the orientation of tip 142b, protruding element 136b can counter a shear force in a direction denoted by an arrow 146b. As shown, arrows 144b and 146b are in opposing directions. Accordingly, FIGS. 10 and 11 show protruding elements 136a and 136b with tips 142a and 142b, respectively, oriented in opposing directions. Protruding elements 136a and 136b (representing protruding elements 134 in FIG. 7) are designed (collectively) to counter shear forces that are exerted on friction member 128 in two different, or opposing, directions. As a result, adhesive layer 130 is less susceptible to breakdown and can hold friction member 128 despite external forces acting on friction member 128.

Figure 12:
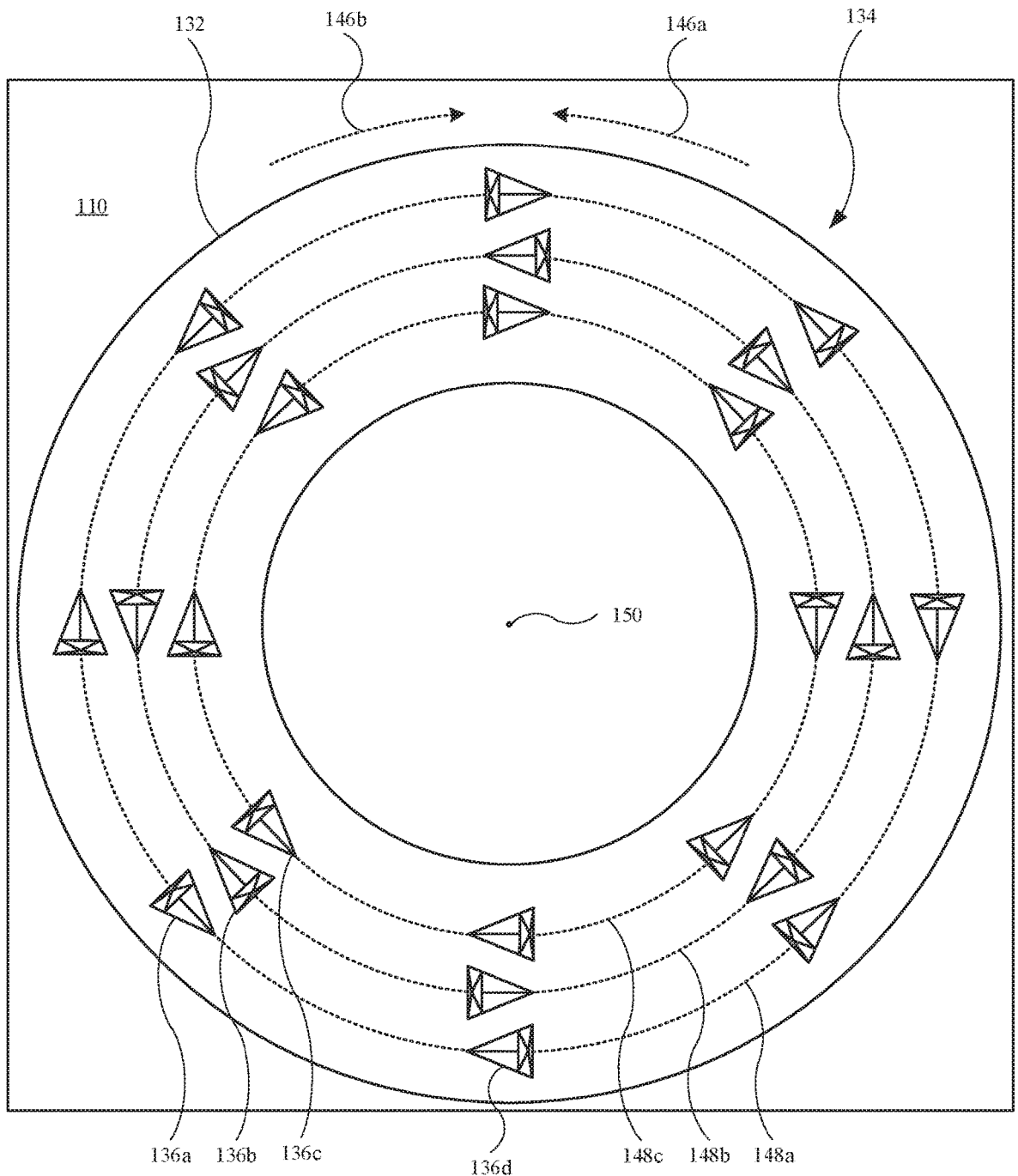
FIG. 12 illustrates a plan view of the back wall, showing the layout of the protruding elements.

FIG. 12 illustrates a plan view of back wall 110, showing the layout of the protruding elements 134. As shown, recess 132 includes a center 150, or center point. Accordingly, center 150 defines a central point of recess 132. Protruding elements 134 are arranged in rows that extend radially outward from center 150. For example, protruding elements 136a, 136b, and 136c (representative of the remaining protruding elements) are in a row that extends radially from center 150.

Alternatively, protruding elements 134 can be described as being arranged in circular patterns that extend around center 150. For example, protruding element 136a is one of several protruding elements (not labeled) that lie on a circular pattern 148a. Also, protruding element 136b is one of several protruding elements (not labeled) that lie on a circular pattern 148b. Further, protruding element 136c is one of several protruding elements (not labeled) that lie on a circular pattern 148c. Circular patterns 148a, 148b, and 148c may define concentric circles (with respect to center 150), with circular pattern 148b surrounding circular pattern 148c, and circular pattern 148a surrounding circular patterns 148b and 148c. While protruding elements 134 are shown as being both aligned in a row that extends radially outward and in circular patterns, in some exemplary embodiments, protruding elements 134 may be aligned in only one of a (radially outward) row or a circular pattern.

Also, in some embodiments, adjacent protruding elements are oriented in the same direction. In the embodiment shown in FIG. 12, adjacent protruding elements are oriented in opposite directions. For example, protruding elements 136a and 136b (adjacent to each other) are in the same row but oriented in opposite directions, and protruding elements 136b and 136c are in the same row but oriented in opposite directions. Accordingly, protruding elements 136a, 136b, and 136c are designed (collectively) to counter shear forces that are exerted on friction member 128 (shown in FIG. 7) in two different such as the directions denoted by arrows 146a and 146b. Similarly, a protruding element 136d, adjacent to protruding element 136a along circular pattern 148a, is oriented in the opposite direction as that of protruding element 136a. Accordingly, adjacent protruding elements located on the same circular pattern may be oriented in opposite directions. In either event, protruding elements 134 are oriented to counter/offset forces in multiple directions.

FIGS. 13-17 show and describe different housings (or back walls of housings). The housings may be integrated (or substituted) with electronic devices shown and described herein.

Figure 13:
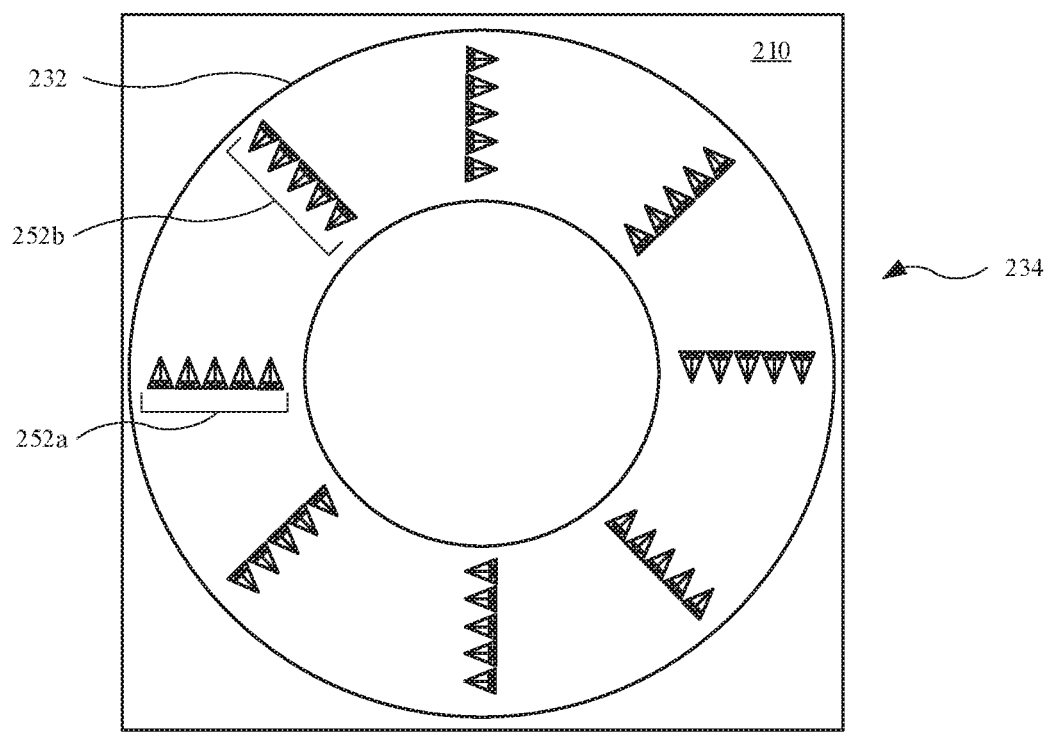
FIG. 13 illustrates a plan view of an alternate embodiment of a back wall, showing an alternate layout for protruding elements.

FIG. 13 illustrates a plan view of an alternate embodiment of a back wall 210, showing an alternate layout for protruding elements 234. As shown, protruding elements 234 are aligned in rows and extend radially outward from a center of a recess 232. Further, each protruding element in a row of protruding elements are oriented in the same direction. For example, protruding elements 234 include a row of protruding elements 252a and a row of protruding elements 252b, with each row representative of additional rows of protruding elements. However, each of the protruding elements in row of protruding elements 252a is oriented in one direction, while each of the protruding elements in row of protruding elements 252b is orientated in another, opposite direction as compared to the protruding elements in row of protruding elements 252a. Accordingly, the layout of protruding elements 234 can counter/offset shear forces in two different directions, which may include two different rotational directions.

Figure 14:
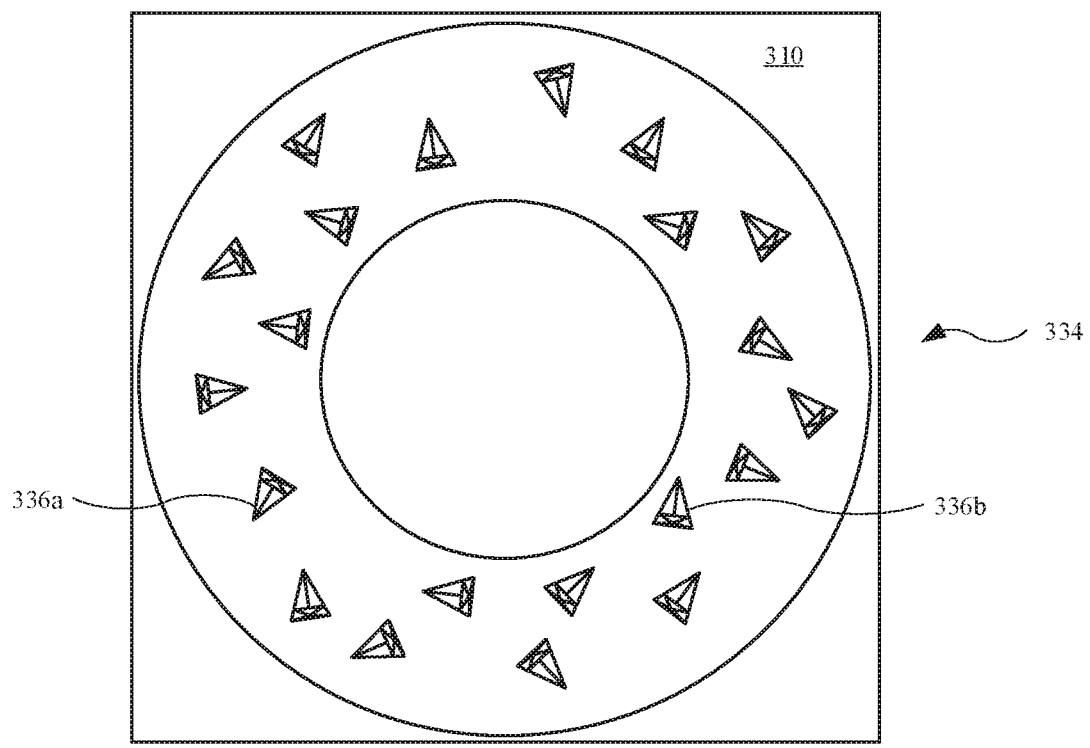
FIG. 14 illustrates a plan view of an alternate embodiment of a back wall, showing yet another layout for protruding elements.

FIG. 14 illustrates a plan view of an alternate embodiment of a back wall 310, showing yet another layout for protruding elements 334. As shown, protruding elements 334 are randomly distributed in terms of their respective position on back wall 310. For example, protruding elements 334 include a protruding element 336a is oriented in one direction, and a protruding element 336b orientated in a different direction as compared to protruding element 336a. Generally, the orientation/direction of protruding elements 336a and 336b may differ in any manner, including (but not limited to) opposing directions. Accordingly, based on the random layout of protruding elements 334, the layout of protruding elements 334 can counter/offset shear forces in many different directions.

Figure 15:
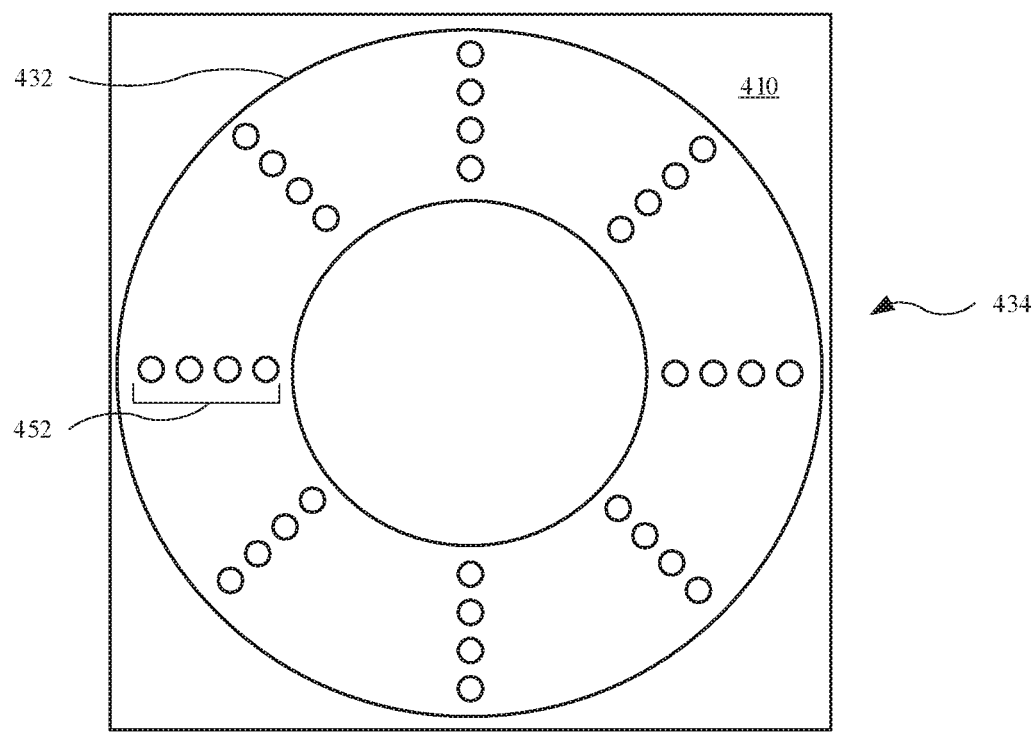
FIG. 15 illustrates a plan view of an alternate embodiment of a back wall, showing protruding elements with a different shape.

FIG. 15 illustrates a plan view of an alternate embodiment of a 410 back wall, showing protruding elements 434 with a different shape. As shown, protruding elements 434 are aligned in rows and extend radially outward from a center of a recess 432. Further, each protruding element is aligned in a row of protruding elements. For example, protruding elements 434 include a row of protruding elements 452 (representative of additional rows of protruding elements). However, unlike the (generally) triangular shape of protruding elements in prior embodiments, each protruding element in row of protruding elements 452 includes a cylindrical shape. As shown, protruding elements 434 are perpendicular with respect to back wall 410. However, in some embodiments (not shown), protruding elements 434 are angled/tilted to counter/offset shear forces in a particular direction (s). Other shapes (e.g., four-sided, oblong) are also possible.

Figure 16:
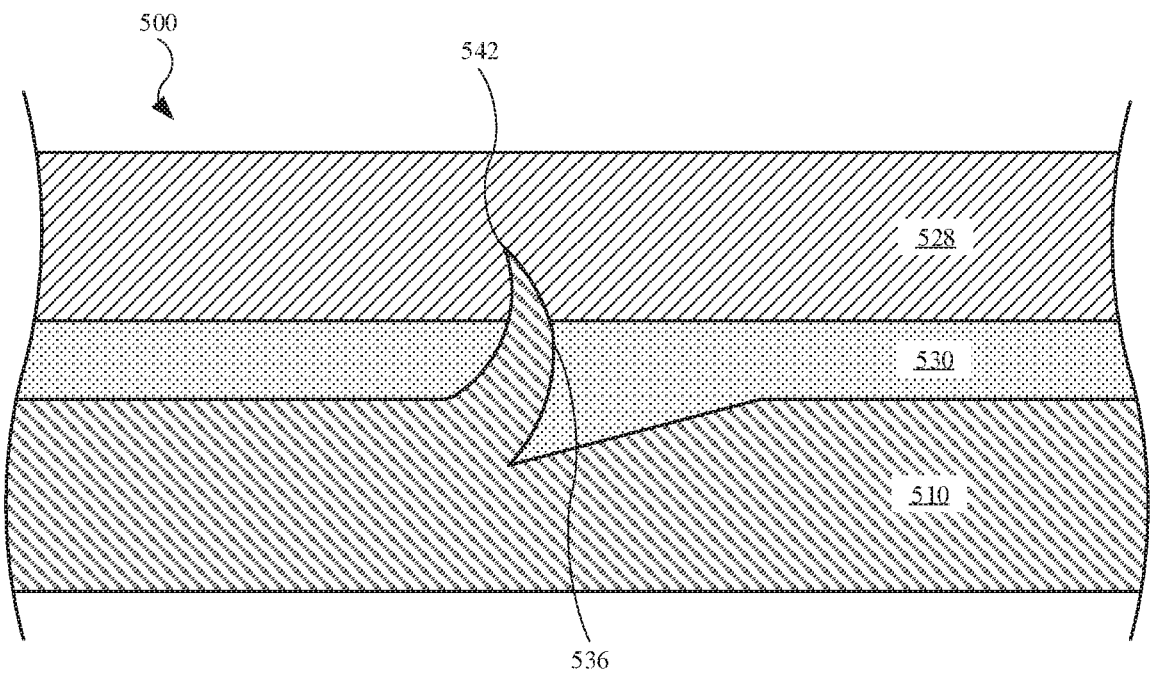
FIG. 16 illustrates a cross sectional view of an alternate embodiment of an electronic device, showing protruding elements extending into a friction member.

FIG. 16 illustrates a cross sectional view of an alternate embodiment of an electronic device 500, showing a protruding element 536 extending into a friction member 528. As shown, electronic device 500 includes a back wall 510 and a friction member 528 secured with back wall 510 by an adhesive layer 530. Further, protruding element 536 (representative of additional protruding elements, not shown, that may be oriented in a similar or different manner) extends from back wall 510. Similar to a prior embodiment (shown in FIGS. 10 and 11), protruding element 536 includes a tip 542, or end region, that extends into adhesive layer 530. However, as shown, protruding element 536 extends through adhesive layer 530 such that tip 542 extends into, or penetrates, friction member 528. As a result, protruding element 536 may provide not only support to adhesive layer 530 in terms of countering shear forces, but may also provide direct support to friction member 528 through mechanical interlocking. Moreover, due in part to protruding element 536 extending into friction member 528, friction member 528 may not require a plate (such as plate 140, shown in FIG. 8).

Figure 17:
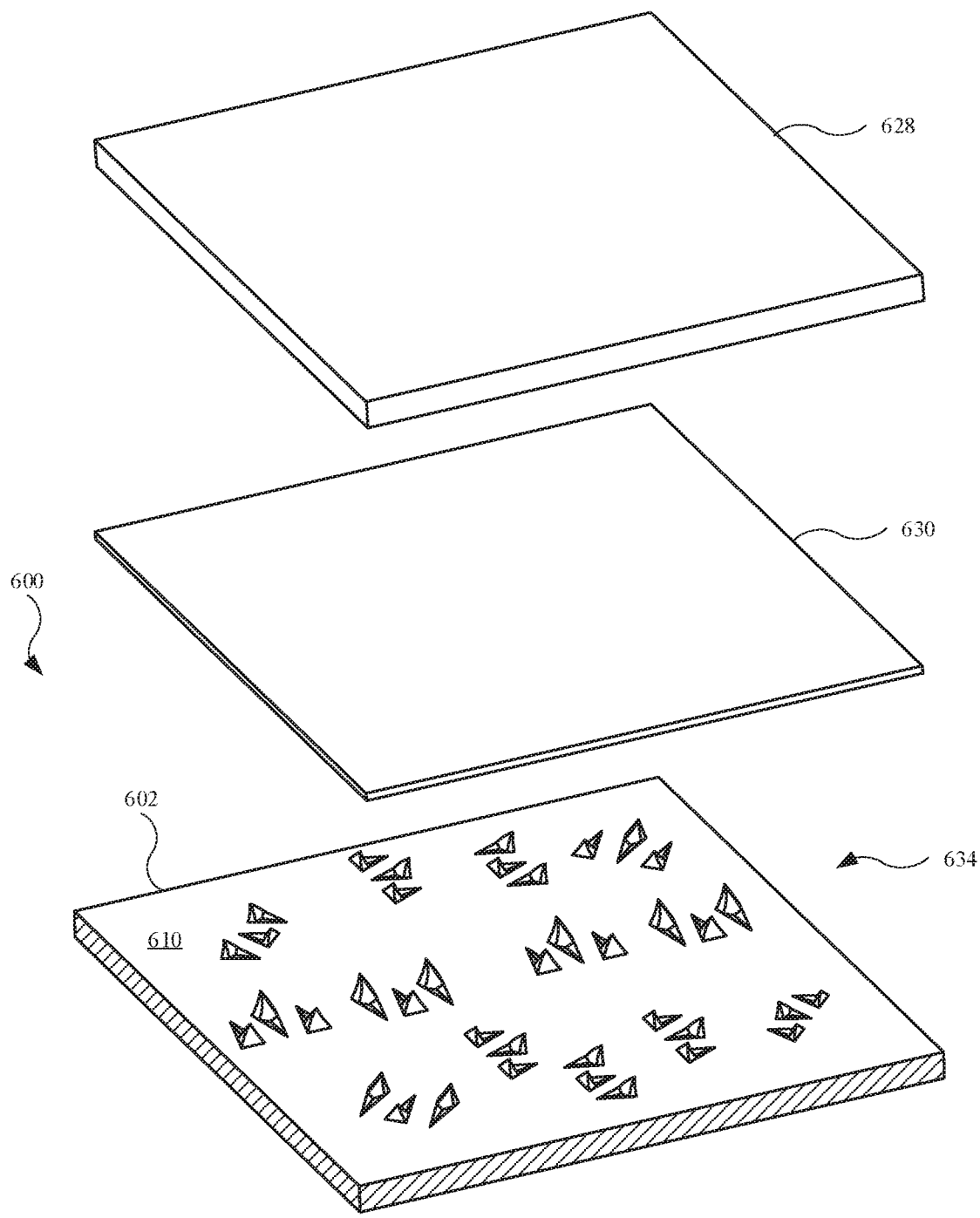
FIG. 17 illustrates an exploded view of an embodiment of an electronic device, showing a housing with an alternate layout of protruding elements.

FIG. 17 illustrates an exploded view of an electronic device 600, showing a housing 602 with an alternate layout of protruding elements 634. Electronic device 600 may include features previously described for an electronic device. As shown, electronic device 600 includes a friction member 628 that is secured with housing 602 by an adhesive layer 630. Protruding elements 634 extend from a back wall 610 of housing 602. In particular, protruding elements 634 are oriented/arranged in several directions. In this manner, protruding elements 634 can counter/offset shear forces applied to friction member 628 in multiple, different directions, including shear forces directed in rotational and linear directions.

Figure 18:
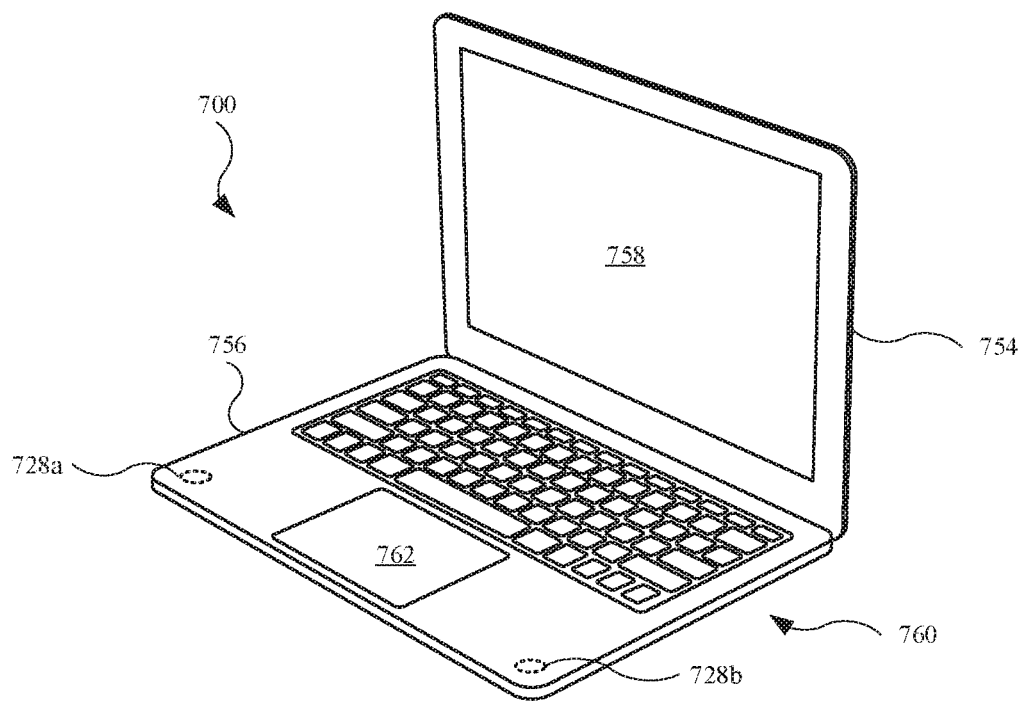
FIG. 18 illustrates an alternate embodiment of an electronic device, showing friction members located on a base portion of the electronic device.
Figure 19:
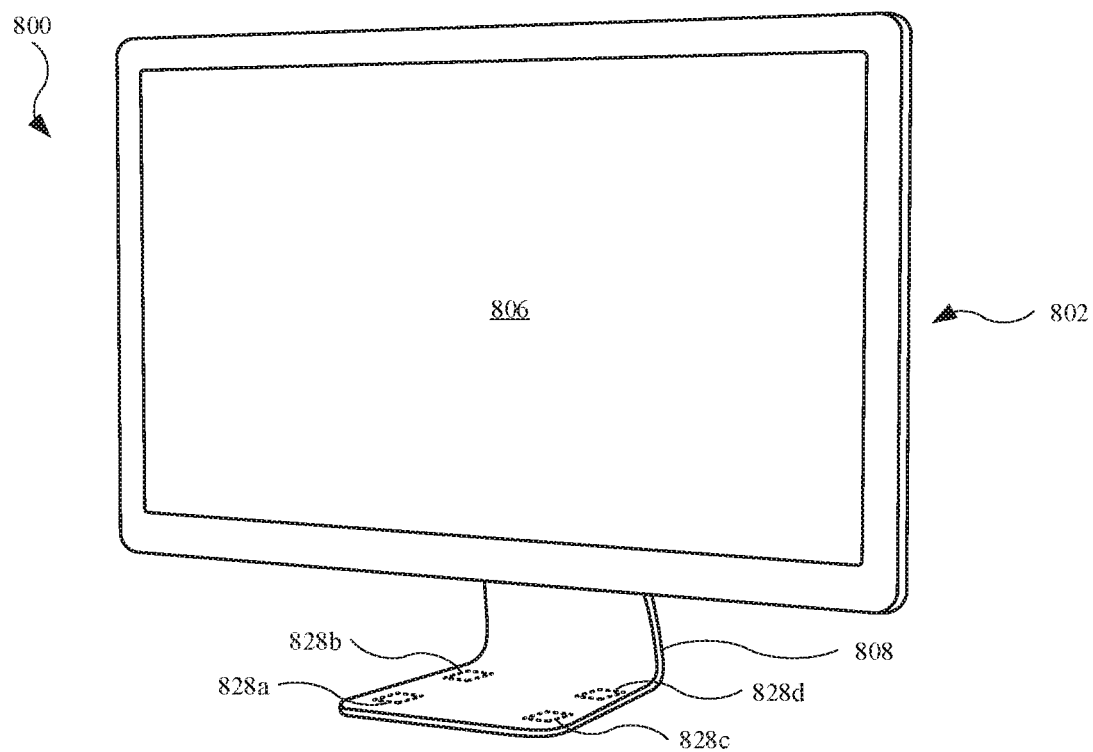
FIG. 19 illustrates an alternate embodiment of an electronic device, showing friction members located on a stand of the electronic device.

The layout of protruding elements in a manner to protruding elements 634 may provide additional benefits to electronic devices, based on their location on the electronic device. For example, FIGS. 18 and 19 show electronic devices with friction members in different locations. The friction members shown in FIGS. 18 and 19 can be secured using protruding elements with features similar to those described in FIG. 17. Accordingly, although not shown, FIGS. 18 and 19 may each include a component with one or more sets of protruding elements, with each set similar in design and layout as that of protruding elements 634 (shown in FIG. 17). Additionally, each component (e.g., housing or stand) of the electronic devices shown in FIGS. 18 and 19 may include a metal, while each friction member shown and described in FIGS. 18 and 19 may include a polymer (e.g., rubber).

FIG. 18 illustrates an alternate embodiment of an electronic device 700, showing friction members located on a base portion 756 of electronic device 700. Electronic device 700 may include a laptop computing device. In this regard, electronic device 700 may include a display housing 754 rotationally coupled with base portion 756. Display housing 754 carries a display 758 designed to present visual information. Base portion 756 includes a keyboard 760 and track pad 762, each designed to provide inputs that alter visual information presented on display 758.

Additionally, base portion 756 includes several friction members on a bottom surface. For example, base portion 756 includes a friction member 728a and a friction member 728b (representative of additional protruding members, not shown). Friction members 728a and 728b are positioned as a support or buffer between base portion 756 and a surface (e.g., desk, table). Accordingly, friction members 728a and 728b can protect base portion 756 against scratching or other damage.

Based on their location, friction members 728a and 728b can undergo shear forces when electronic device 700 slides across a surface. Moreover, due to electronic device 700 being able to slide in virtually any direction along a two-dimensional plane, base portion 756 may include several sets of protruding elements with a layout similar to the layout of protruding elements 634 (shown in FIG. 17). Generally, one set of protruding elements is formed on base portion 756 for each friction member. Accordingly, friction members 728a and 728b are more likely to remain secured with base portion 756, as the protruding elements can counter/offset shear force in many different directions.

In another example, FIG. 19 illustrates an alternate embodiment of an electronic device 800, showing friction members located on a stand 808 of electronic device 800. Electronic device 800 may include a display, similar to electronic device 100 (shown in FIG. 1). Accordingly, electronic device 800 may include a housing 802 that carries a display 806. Also, electronic device 800 is adapted to couple with a stand 808 such that housing 802 can rotate relative to stand 808.

Further, stand 808 includes several protruding members on a bottom surface. For example, stand 808 includes a friction member 828*a*, a friction member 828*b*, a friction member 828*c*, and a friction member 828*d*. Friction members 828*a*, 828*b*, 828*c*, and 828*d* are positioned as a support or buffer between stand 808 and a surface (e.g., desk, table). Accordingly, friction members 828*a*, 828*b*, 828*c*, and 828*d* can protect stand 808 against scratching or other damage.

Similar to friction members 728*a* and 728*b* (shown in FIG. 18), friction members 828*a*, 828*b*, 828*c*, and 828*d* can undergo shear forces when electronic device 800 slides across a surface. Also, stand 808 may include several sets of protruding elements with a layout similar to the layout of protruding elements 634 (shown in FIG. 17). Generally, one set of protruding elements is formed on stand 808 for each friction member. Accordingly, friction members 828*a*, 828*b*, 828*c*, and 828*d* are more likely to remain secured with stand 808, as the protruding elements can counter/offset shear force in many different directions.

Figure 20:
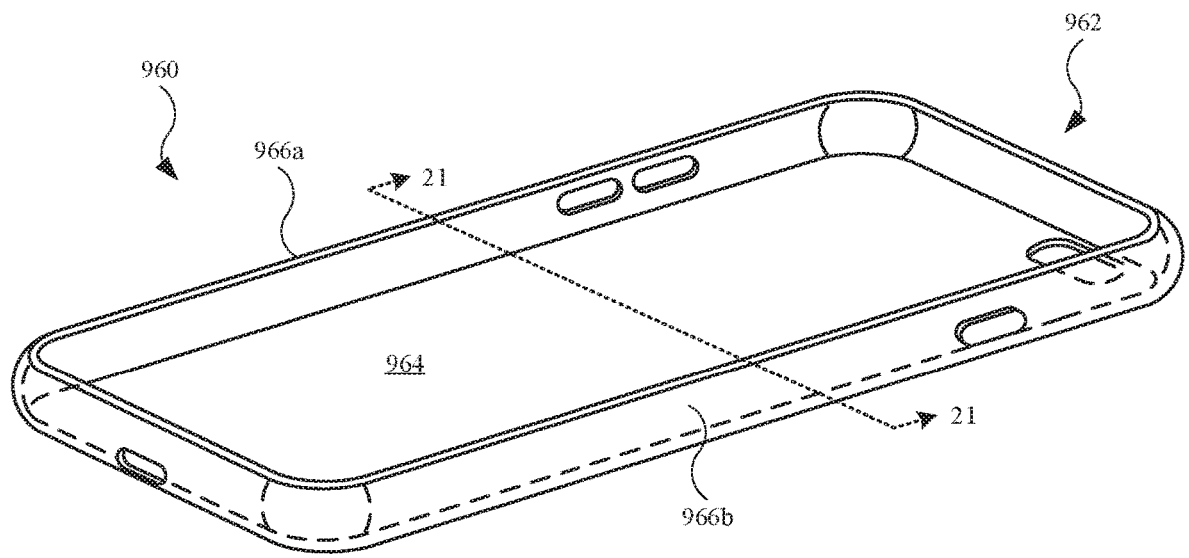
FIG. 20 illustrates an embodiment of an accessory device.

FIG. 20 illustrates an embodiment of an accessory device 960. As shown, accessory device 960 is designed for use with portable electronic devices, such as smartphones and tablet computing devices. In this regard, accessory device 960 may include an internal volume 962, or space, to hold a portable electronic device. Accessory device 960 may include a back wall 964 and sidewalls (including a sidewall 966*a* and a sidewall 966*b*) that define internal volume 962.

Figure 21:
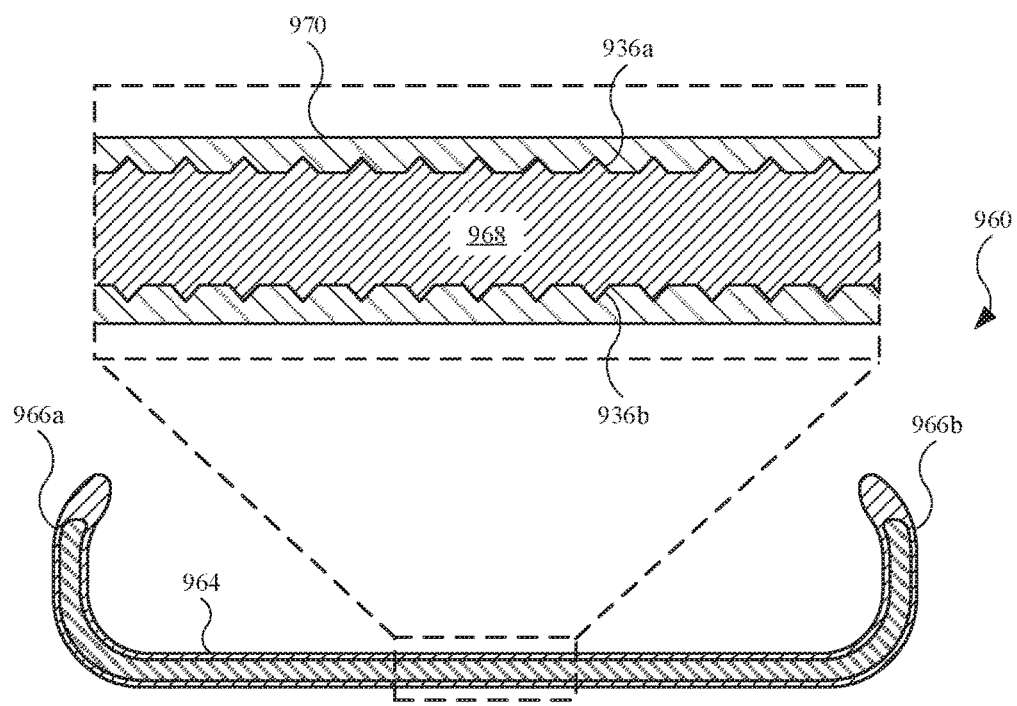
FIG. 21 illustrates a cross sectional view of the accessory device shown in FIG. 20, taken along line 21-21, showing a substrate with protruding elements.

Accessory device 960 may be formed from two or more materials. For example, FIG. 21 illustrates a cross sectional view of accessory device 960 shown in FIG. 20, taken along line 21-21, showing a substrate 968 with protruding elements. In some embodiments, substrate 968 includes a polymer material, such as a polycarbonate or other rigid plastic. Also, accessory device 960 may include an outer layer 970 that covers multiple surfaces of substrate 968, including back wall 964 and sidewalls 966*a* and 966*b*. Outer layer 970 may include silicone, as a non-limiting example. Accordingly, substrate 968 and outer layer 970 can be formed from different materials.

As shown in the enlarged view, substrate 968 includes a protruding member 936*a* (representative of additional protruding elements) located on one surface of substrate 968, as well as a protruding member 936*b* (representative of additional protruding elements) located on another surface of substrate 968. Protruding members 936*a* and 936*b* are designed to provide additional surface area with which outer layer 970 bonds. Accordingly, the retaining force provided to outer layer 970 (to remain with substrate 968) may be increased based on protruding members 936*a* and 936*b*. Although not shown, protruding member (similar to protruding members 936*a* and 936*b*) may be formed along any regions of back wall 964 and/or sidewalls 966*a* and 966*b*.

Figure 22:
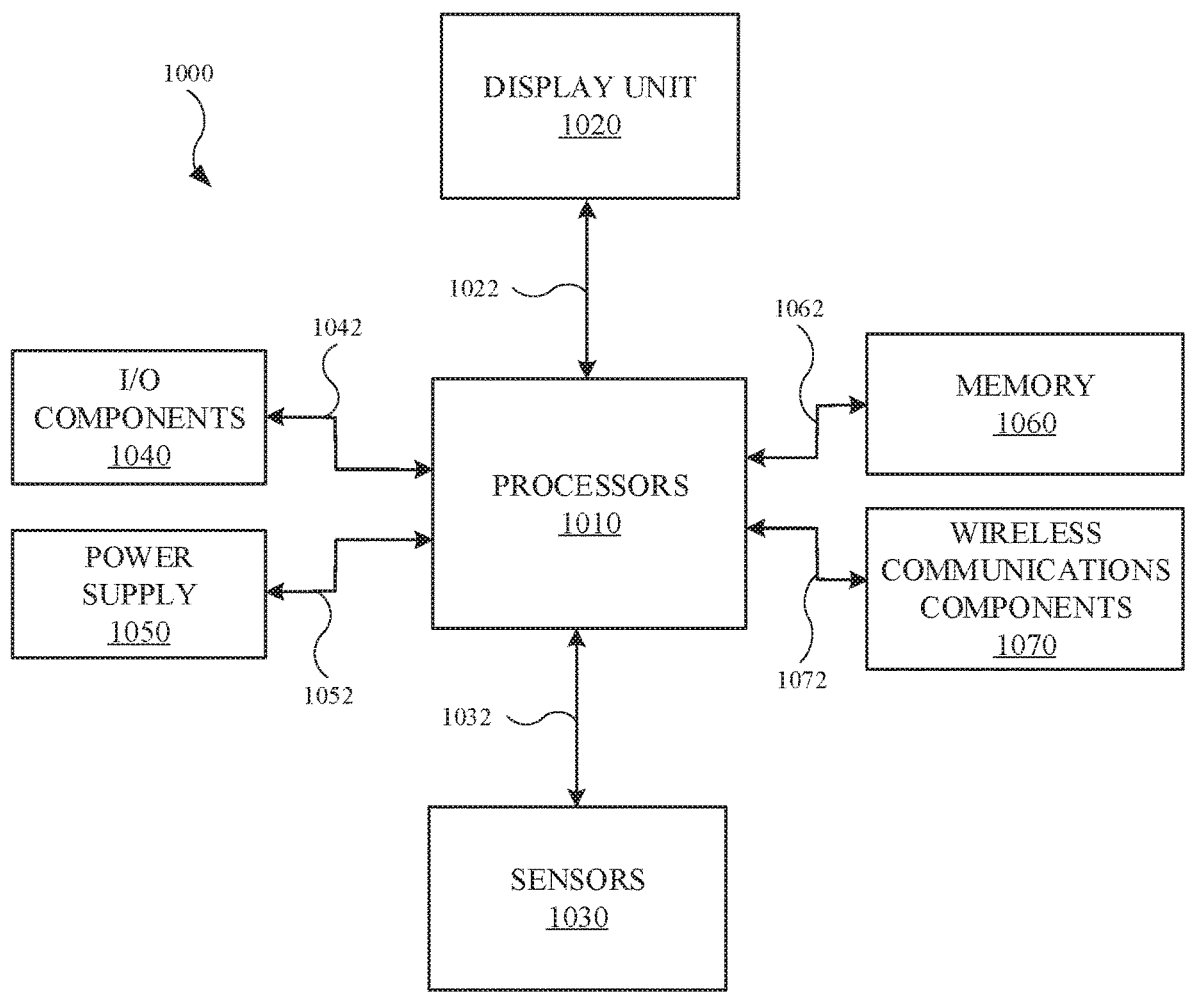
FIG. 22 illustrates a block diagram of an electronic device, in accordance with some described embodiments.

FIG. 22 illustrates a block diagram of an electronic device 1000, in accordance with some described embodiments. The features in electronic device 1000 may be present in other electronic devices described herein. Electronic device 1000 may include one or more processors 1010 for executing functions of the electronic device 1000. One or more processors 1010 can refer to at least one of a central processing unit (CPU) and at least one microcontroller for performing dedicated functions. Also, one or more processors 1010 can refer to application specific integrated circuits.

According to some embodiments, electronic device 1000 can include a display unit 1020. Display unit 1020 is capable of presenting a user interface that includes icons (representing software applications), textual images, and/or motion images. In some examples, each icon can be associated with a respective function that can be executed by one or more processors 1010. In some cases, display unit 1020 includes a display layer (not illustrated), which can include a liquid-crystal display (LCD), light-emitting diode display (LED), or the like. According to some embodiments, display unit 1020 includes a touch input detection component and/or a force detection component that can be configured to detect changes in an electrical parameter (e.g., electrical capacitance value) when the user's appendage (acting as a capacitor) comes into proximity with display unit 1020 (or in contact with a transparent layer that covers the display unit 1020). Display unit 1020 is connected to one or more processors 1010 via one or more connection cables 1022.

According to some embodiments, electronic device 1000 can include one or more sensors 1030 capable of provide an input to one or more processors 1010 of electronic device 1000. One or more sensors 1030 may include a temperature sensor, a capacitive sensor, and magnetic field sensors, as a non-limiting example. One or more sensors 1030 is/are connected to one or more processors 1010 via one or more connection cables 1032.

According to some embodiments, electronic device 1000 can include one or more input/output components 1040. In some cases, the one or more input/output components 1040 can refer to a button or a switch that is capable of actuation by the user. When one or more input/output components 1040 are used, one or more input/output components 1040 can generate an electrical signal that is provided to one or more processors 1010 via one or more connection cables 1042.

According to some embodiments, electronic device 1000 can include a power supply 1050 that is capable of providing energy to the operational components of electronic device 1000. In some examples, power supply 1050 can refer to a rechargeable battery. Power supply 1050 can be connected to one or more processors 1010 via one or more connection cables 1052. The power supply 1050 can be directly connected to other devices of electronic device 1000, such as one or more input/output components 1040. In some examples, electronic device 1000 can receive power from another power sources (e.g., an external charging device).

According to some embodiments, the electronic device 1000 can include memory 1060, which can include a single disk or multiple disks (e.g., hard drives), and includes a storage management module that manages one or more partitions within memory 1060. In some cases, memory 1060 can include flash memory, semiconductor (solid state) memory or the like. Memory 1060 can also include a Random Access Memory ("RAM") and a Read-Only Memory ("ROM"). The ROM can store programs, utilities or processes to be executed in a non-volatile manner. The RAM can provide volatile data storage, and stores instructions related to the operation of the electronic device 1000. In some embodiments, memory 1060 refers to a non-transitory computer readable medium. One or more processors 1010 can also be used to execute software applications.

In some embodiments, a data bus 1062 can facilitate data transfer between memory 1060 and one or more processors 1010.

According to some embodiments, electronic device 1000 can include wireless communications components 1070. A network/bus interface 1072 can couple wireless communications components 1070 to one or more processors 1010. Wireless communications components 1070 can communicate with other electronic devices via any number of wireless communication protocols, including at least one of a global network (e.g., the Internet), a wide area network, a local area network, a wireless personal area network (WPAN), or the like. In some examples, the wireless communications components 1070 can communicate using NFC protocol, BLUETOOTH® protocol, or WIFI® protocol.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. An electronic device, comprising:
a display;
a housing coupled with the display, the housing comprising:
a back wall formed from a first type material, and protruding elements extending from the back wall;
an adhesive layer disposed on the back wall, wherein the protruding elements extend into the adhesive layer; and
a friction member formed from a second type material different than the first type material, the friction member secured with the back wall by the adhesive layer.

2. The electronic device of claim 1, wherein the back wall defines a first surface texture and the protruding elements define a second surface texture different from the first surface texture.

3. The electronic device of claim 1, wherein the back wall defines a recess, and the protruding elements are disposed on the back wall at the recess.

4. The electronic device of claim 3, wherein the recess comprises a circular recess having a center, and the protruding elements comprise:
a first row of protruding elements extending radially from the center; and
a second row of protruding elements extending radially from the center.

5. The electronic device of claim 4, wherein the first row of protruding elements comprise:
a first protruding element comprising a first tip oriented in a first direction; and
a second protruding element comprising a second tip oriented in a second direction opposite the first direction.

6. The electronic device of claim 4, wherein the friction member comprises a circular friction member positioned on the back wall at the circular recess.

7. The electronic device of claim 1, further comprising a magnet disposed in the housing and aligned with the friction member.

8. The electronic device of claim 1, further comprising a plate secured to the adhesive layer, wherein the friction member is disposed on the plate.

9. An electronic device, comprising:
a display;
a housing coupled with the display, the housing comprising:
sidewalls,
a back wall that combines with the sidewalls to define an internal volume, the back wall comprising a first surface and a second surface opposite the first surface,
protruding elements disposed on the back wall and extending from the first surface,
an adhesive layer disposed on the first surface, the adhesive layer covering the protruding elements;
a magnet disposed in the internal volume and secured with the second surface, the magnet configured to magnetically couple with a magnet of a stand; and
a friction member secured with the back wall by the adhesive layer, the friction member configured to engage at least one of the magnet or the stand.

10. The electronic device of claim 9, wherein the protruding elements extend into the adhesive layer.

11. The electronic device of claim 9, wherein:
the first surface defines a circular recess,
the protruding elements are disposed on the first surface at the circular recess, and
the friction member comprises a circular friction member disposed on the first surface at the circular recess.

12. The electronic device of claim 11, wherein the circular recess defines a center, and the protruding elements comprise:
a first row of protruding elements extending radially from the center; and
a second row of protruding elements extending radially from the center.

13. The electronic device of claim 9, wherein the protruding elements are arranged in a first circular pattern and a second circular pattern that surrounds the first circular pattern.

14. The electronic device of claim 13, wherein the protruding elements in the first circular pattern comprise:
   a first protruding element comprising a first tip oriented in a first direction;
   a second protruding element comprising a second tip oriented in a second direction opposite the first direction.

15. The electronic device of claim 9, wherein the protruding elements extend into the friction member.

16. An electronic device, comprising:
   a display;
   a housing coupled with the display, the housing comprising:
      a back wall,
      a first protruding element extending from the back wall, the first protruding element comprising a first tip oriented in a first direction;
      a second protruding element extending from the back wall and adjacent to the first protruding element, the second protruding element comprising a second tip oriented in a second direction opposite the first direction;
   an adhesive layer disposed on the back wall, wherein the first protruding element and the second protruding element extend into the adhesive layer;
   a plate secured with the back wall by the adhesive layer; and
   a friction member secured with the plate.

17. The electronic device of claim 16, wherein the first protruding element and the second protruding element at least partially define a row of protruding elements.

18. The electronic device of claim 16, wherein the first protruding element and the second protruding element at least partially define a circular pattern of protruding elements.

19. The electronic device of claim 16, further comprising a magnet disposed in the housing and aligned with the friction member.

20. The electronic device of claim 16, wherein the plate comprises a metal layer.

* * * * *